United States Patent [19]
Chen

[11] Patent Number: 6,121,696
[45] Date of Patent: Sep. 19, 2000

[54] EMI PREVENTIVE AC LINE FILTER

[75] Inventor: Tei-Min Chen, Taipei, Taiwan

[73] Assignee: Jen-Yu Pan, Taipei, Taiwan

[21] Appl. No.: 09/225,705

[22] Filed: Jan. 6, 1999

[51] Int. Cl.[7] ...................................................... H05K 9/00
[52] U.S. Cl. ............................ 307/91; 333/177; 333/185; 336/181; 336/221; 361/818
[58] Field of Search ............................... 307/91; 336/181, 336/221, 178; 333/185, 177; 361/111, 818

[56] References Cited

U.S. PATENT DOCUMENTS

| | | | |
|---|---|---|---|
| 5,083,101 | 1/1992 | Fredrick | 333/185 |
| 5,119,266 | 6/1992 | Petry | 361/111 |
| 5,528,205 | 6/1996 | Wong | 333/177 |
| 5,731,666 | 3/1998 | Folker et al. | 336/181 |
| 5,969,583 | 10/1999 | Hutchison | 333/181 |

*Primary Examiner*—Albert W. Paladini
*Attorney, Agent, or Firm*—Bacon & Thomas

[57] ABSTRACT

An EMI preventive AC line filter includes rack having a rectangular top open chamber and two substantially U-shaped support arms at two opposite ends of the top open chamber, a cylindrical winding holder formed of two symmetrical halves and mounted in the top open chamber of the rack, the winding holder having an axially extended cylindrical coupling groove at the center, and an iron core coupled to the winding holder and secured to the rack to hold the winding holder in place, the iron core having a U-shaped peripheral wall forced into engagement with the U-shaped support arms of the rack, and a cylindrical shaft connected between two parallel side wall portions of the U-shaped peripheral wall and received in the axially extended cylindrical coupling groove in the winding holder.

5 Claims, 5 Drawing Sheets

EMI PREVENTIVE AC LINE FILTER

BACKGROUND OF THE INVENTION

The present invention relates to an AC line filter, and more particularly to an EMI preventive AC line filter which is space-saving, and can effectively eliminate electromagnetic interference.

FIGS. 1 and 2 show an AC line filter according to the prior art. This structure of AC line filter is comprised of a cylindrical winding holder formed of two symmetrical halves 50, a rectangular iron core formed of two substantially U-shaped symmetrical halves 4, and a rack 6. The symmetrical halves 50 of the cylindrical winding holder each comprise a plurality of partition grooves 52, a plurality of winding grooves 51 separated by the partition grooves 52, a toothed portion 53 at one end, and an axially extended coupling groove 54 of semi-circular cross section. By means of the axially extended coupling grooves 54, the symmetrical halves 50 of the cylindrical winding holder can be attached to the fixed shaft of a winding machine, enabling the toothed portions 53 of the symmetrical halves 50 of the cylindrical winding holder to be set into engagement with the driving mechanism of the winding machine, so that enable wires can be automatically wind round the winding grooves 51. The two symmetrical halves 4 of the iron core are fastened together and coupled to the winding assembly of the cylindrical winding holder, and installed in the rack 6. The rack 6 comprises a longitudinal coupling groove 61, which receives the symmetrical halves 4 of the iron core, symmetrical support arms 63 disposed at two opposite sides of the longitudinal coupling groove 61, which support the cylindrical winding holder in place, and two partition blocks 62 disposed at two opposite sides of the longitudinal coupling groove 61 on the middle, the partition blocks 62 each having a plurality of ribs 621 respectively engaged into the partition grooves 52 at the symmetrical halves 50 of the cylindrical winding holder. This structure of AC line filter is still not satisfactory in function. Because the axially extended coupling grooves 54 of the symmetrical halves 50 of the cylindrical winding holder are not tightly matched with the symmetrical halves 4 of the iron core, a magnetic resistance is produced in gaps in the axially extended coupling grooves 54 around the symmetrical halves 4 of the iron core, causing the filtration effect of the EMI preventive AC line filter to be affected. Further, because of the design of the partition grooves 52 at the symmetrical halves 50 of the cylindrical winding holder, the space for the winding grooves 51 is relatively reduced. In order to provide sufficient space for the winding grooves 51, the size of the cylindrical winding holder must be relatively increased.

SUMMARY OF THE INVENTION

The present invention has been accomplished to provide an EMI preventive AC line filter which eliminates the aforesaid drawbacks. According to one aspect of the present invention, the winding holder has an axially extended cylindrical coupling groove at the center for coupling to the iron core, and the iron core has a cylindrical shaft connected between two parallel side wall portions of a substantially U-shaped peripheral wall and received in the cylindrical coupling groove at the winding holder. According to another aspect of the present invention, the rack comprises a top open chamber, which receives the winding holder, and two Unshaped support arms, which hold the iron core firmly in place, enabling the winding holder to be firmly received in the top open chamber.

DETAILED DESCRIPTION OF THE PREFERRED EMBODIMENTS

Figure 2:
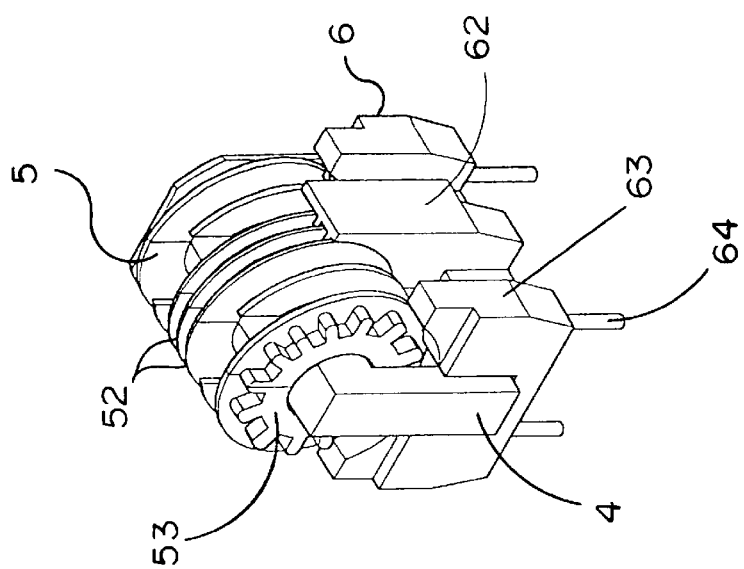
FIG. 2 is an assembly view of FIG. 1.
Figure 1:
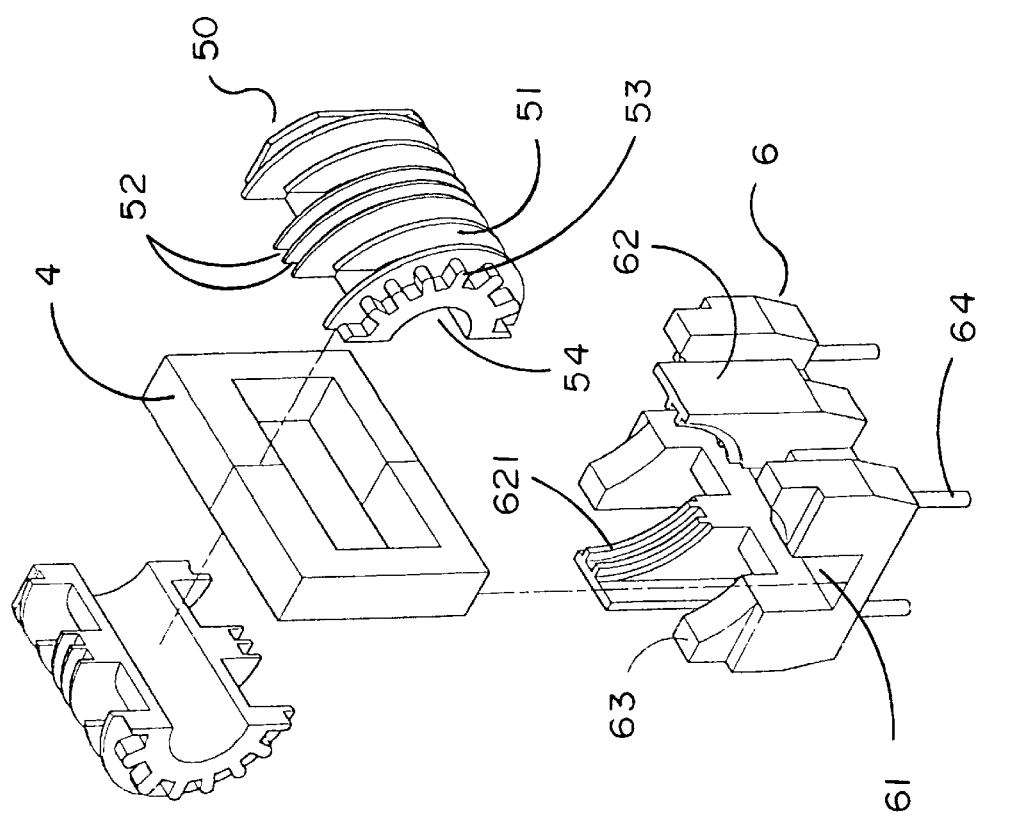
FIG. 1 is an exploded view of an AC line filer according to the prior art.

Referring to FIGS. from 3 through 6, an EMI (electromagnetic interference) preventive AC line filter in accordance with the present invention is generally comprised of a rack 3, a cylindrical winding holder 2 mounted on the rack 3, and an iron core coupled to the winding holder 2.

The iron core 1 comprises a cylindrical shaft 11 connected between two parallel side wall portions of a substantially U-shaped peripheral wall thereof. The winding holder 2 is comprised of two symmetrical halves 20. Each half 20 comprises at least one partition groove 22), a plurality of winding grooves 21 separated from one another by the at least one partition groove 22, a toothed portion 23 at one end, and an axially extended coupling groove 24 of semi-circular cross section. The rack 3 comprises a substantially rectangular top open chamber 31 for receiving the winding holder 2, two substantially U-shaped support arms 32 arranged in parallel at two opposite ends of the top open chamber 31, a plurality of vertical wire grooves 33 at two opposite lateral side walls thereof, and a plurality of bottom mounting rods 34 respectively raised from the bottom side wall thereof adjacent to the wire grooves 33.

Referring to FIGS. from 3 through 6 again, the two symmetrical halves 20 of the winding holder 2 are fastened together and coupled to the iron core 1, enabling the cylindrical shaft 11 of the iron core 1 to be received in the circular through hole formed of the axially extended coupling grooves 24 of the two symmetrical halves 20 of the winding holder 2. When the assembly of the iron core 1 and the winding holder 2 is loaded on a winding machine, the toothed portions 23 of the winding holder 2 are coupled to the driving mechanism of the winding machine and rotated by it, enabling enabled wires to be respectively wound round the winding grooves 21. The diameter of the circular through hole of the axially extended coupling grooves 24 of the two symmetrical halves 20 of the winding holder 2 is approximately equal to the diameter of the shaft 11 of the iron core 1, therefore no gap is left between the peripheral of the shaft 11 of the iron core 1 and the inside wall of the cylindrical winding holder 2, however, the cylindrical winding holder 2 is still allowed to be turned about the shaft 11 of the iron core 1. The winding assembly of the winding holder 2 and the iron core 1 is installed in the rack 3, enabling the winding holder 2 to be received in the top open chamber 31, and the two parallel side wall portions of the substantially U-shaped shaped peripheral wall of the iron core 1 to be forced into engagement with the U-shaped support arms 32. When assembled, the lead wires of the windings at the winding holder 2 are respectively extended out of the wire grooves 33 and welded to the mounting rods 34.

Figure 3:
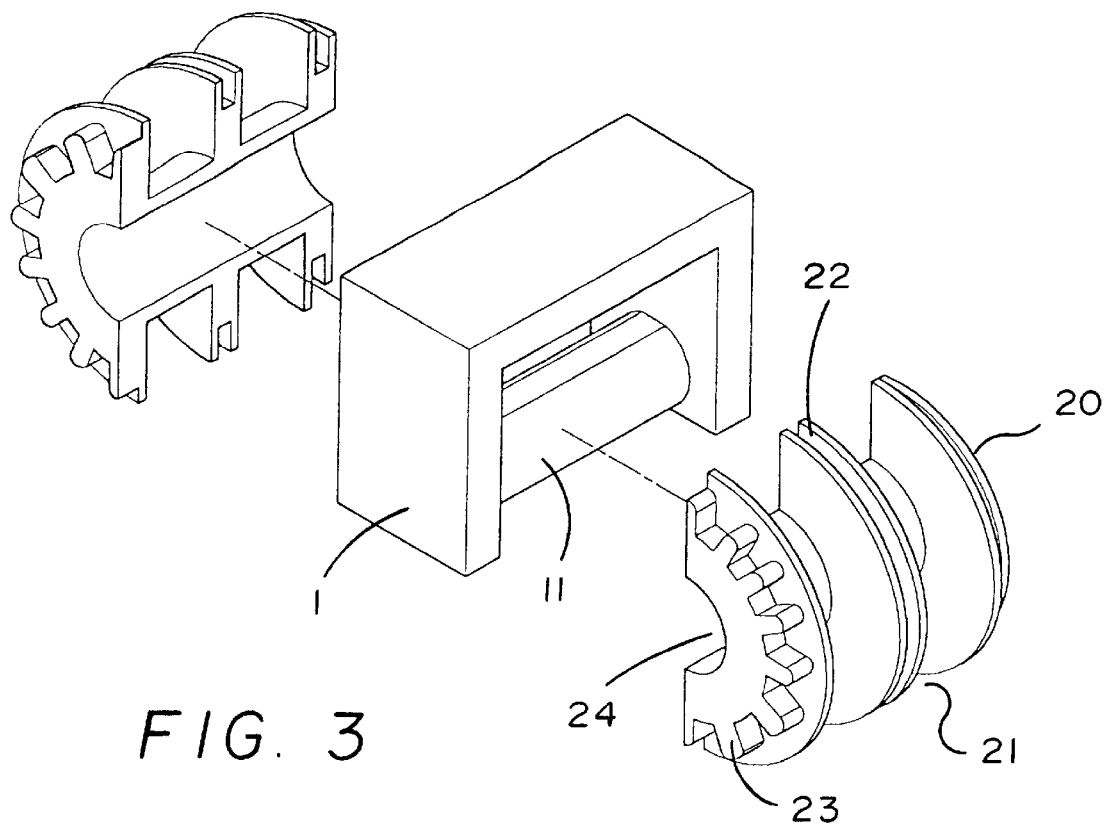
FIG. 3 is an exploded view of an iron core and a winding holder for an EMI preventive AC line filter according to the present invention.
Figure 4:
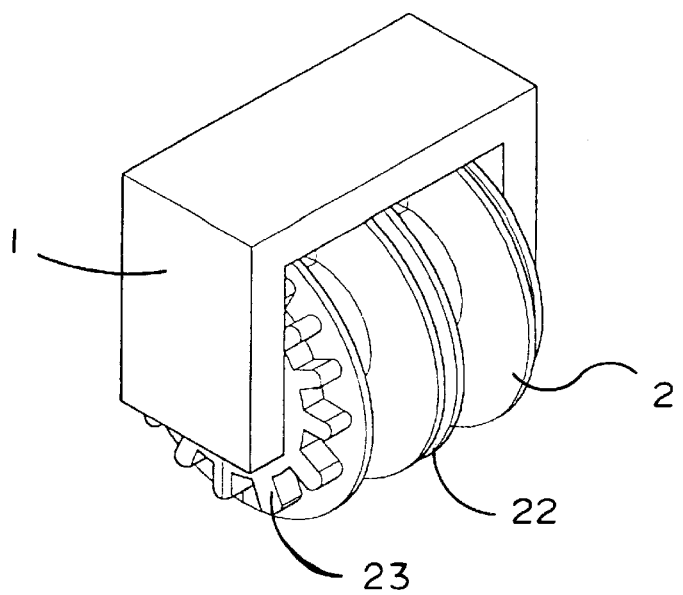
FIG. 4 is an assembly view of FIG. 3.
Figure 5:
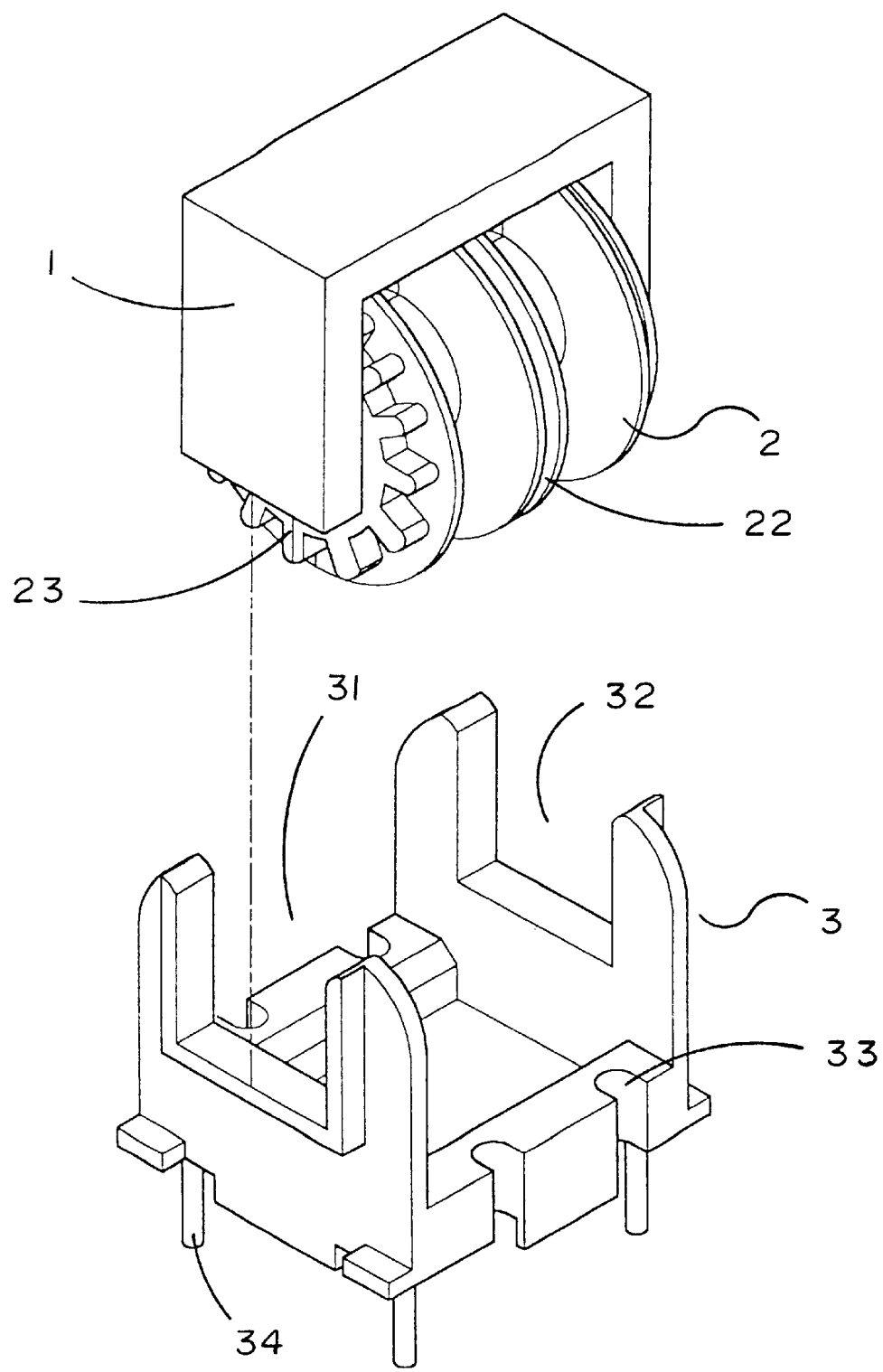
FIG. 5 is an exploded view of an EMI preventive AC line filter according to the present invention.
Figure 6:
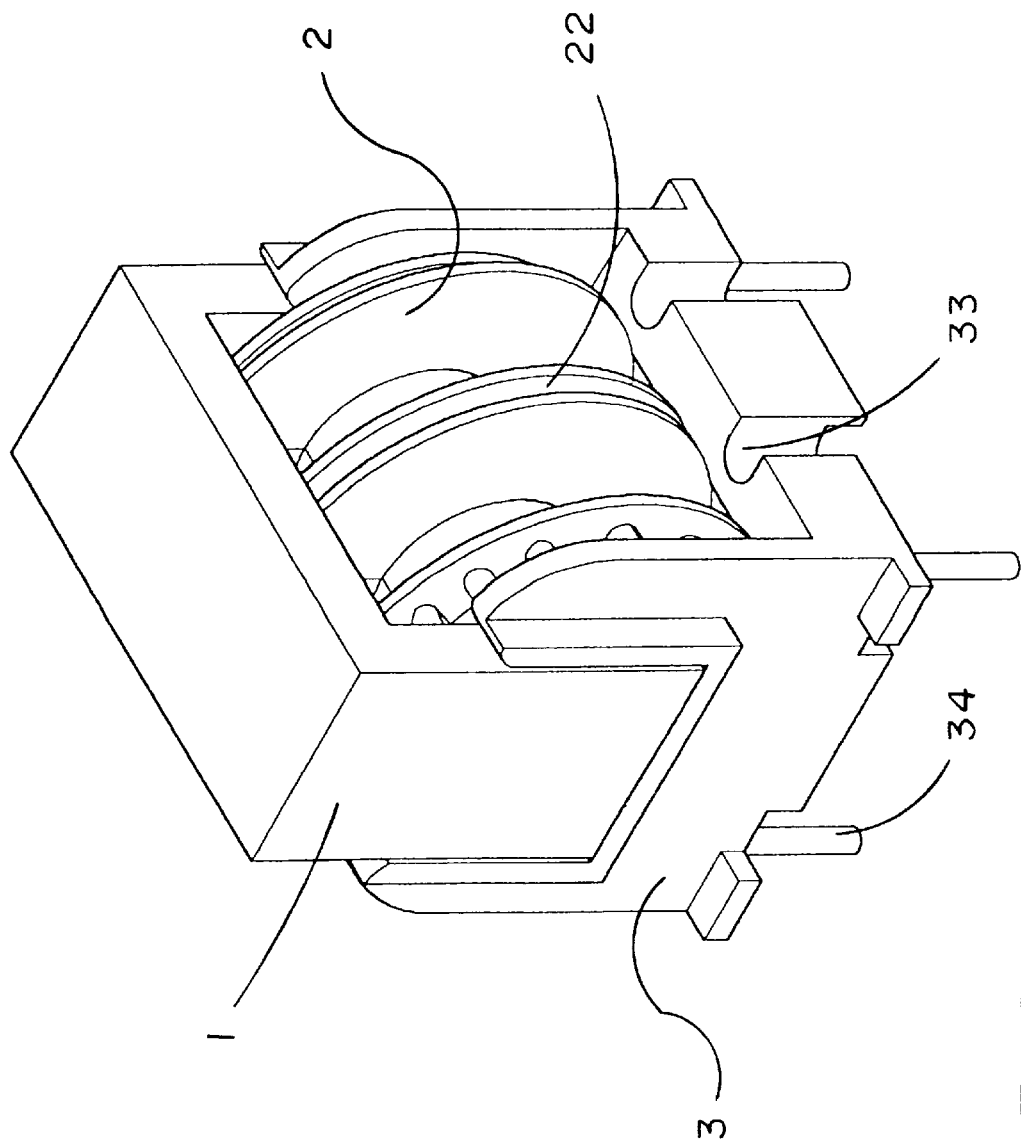
FIG. 6 is an assembly view of FIG. 5.
Figure 7A:
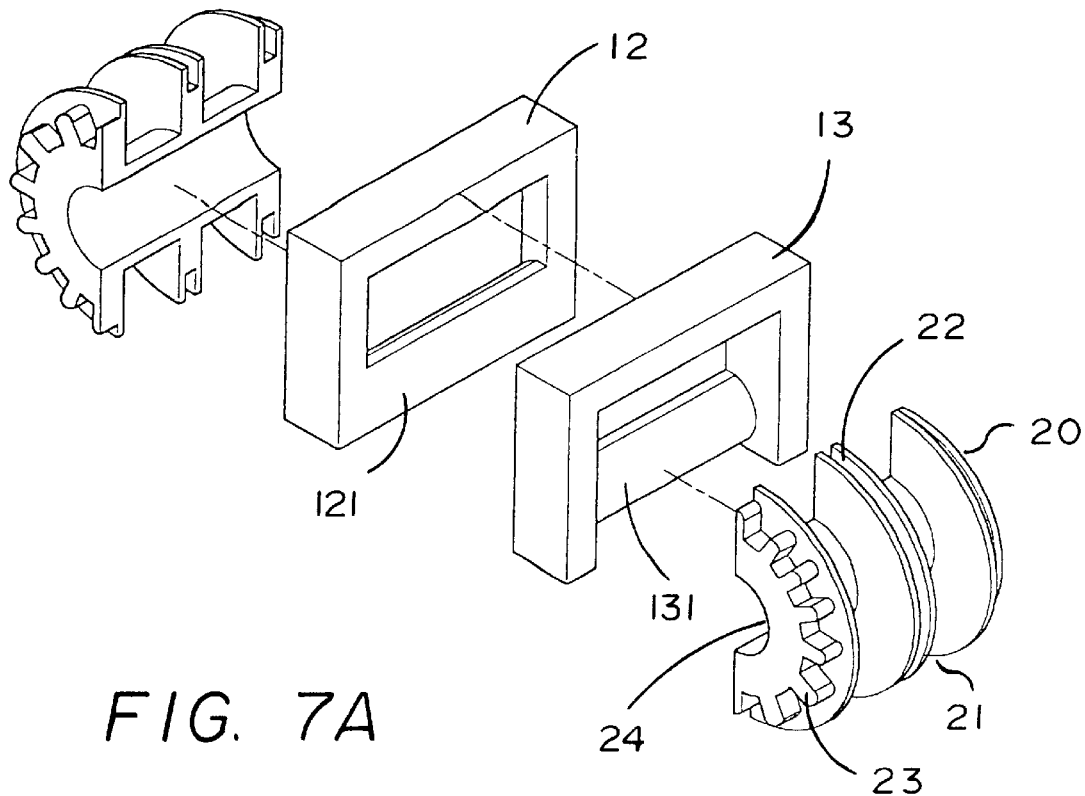
FIG. 7A is an exploded view of an alternate form of the present invention.
Figure 7B:
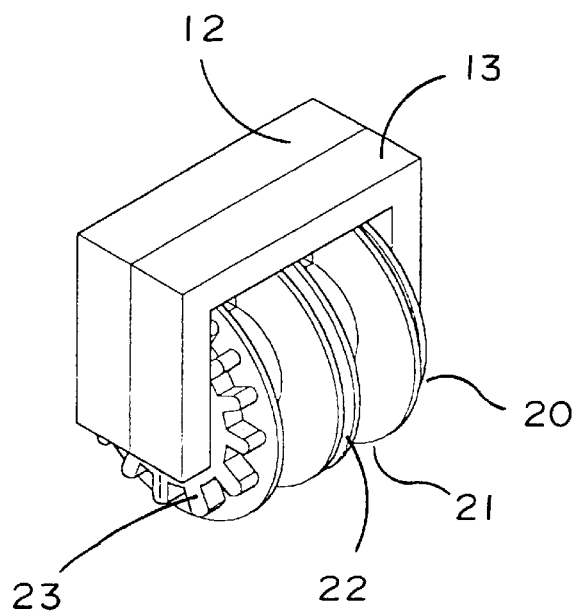
FIG. 7B is an assembly view of FIG. 7A.

FIGS. 7A and 7B show an alternate form of the EMI preventive AC line filter. According to this embodiment, the iron core 1 is formed of two symmetrical halves 12 and 13. Each half 12 or 13 comprises a semi-circular shaft 121 or 131 connected between two parallel side wall portions of a substantially U-shaped peripheral wall thereof. When the two symmetrical halves 12 and 13 are fastened together, the semi-circular shafts 121 and 131 are abutted against each other, forming a cylindrical shaft 11 (see also FIG. 3). This design enables the symmetrical halves 12 and 13 of the iron core 1 to be conveniently removed from the molds during their fabrication process.

It is to be understood that the drawings are designed for purposes of illustration only, and are not intended as a definition of the limits and scope of the invention disclosed.

What is claimed is:

1. An EMI (electromagnetic interference) preventive AC line filter comprising a rack, a winding holder mounted on said rack, said winding holder having windings on it, and an iron core coupled to said winding holder, wherein:

said rack comprises a substantially rectangular top open chamber, which receives said winding holder, and two substantially U-shaped support arms arranged in parallel at two opposite ends of said top open chamber, said winding holder is comprised of two symmetrical halves mounted in the top open chamber of said rack, said symmetrical halves each comprising at least one partition groove, a plurality of winding grooves separated from one another by said at least one partition groove, a toothed portion at one end, and an axially extended coupling groove of semicircular cross section, the axially extended coupling grooves of said symmetrical halves forming an axially extended cylindrical coupling groove in said winding holder;

said iron core is coupled to said winding holder and secured to the U-shaped support arms of said rack to hold said winding holder in place, said iron core comprising a peripheral wall having two parallel side wall portions respectively forced into engagement with the U-shaped support arms of said rack, and a cylindrical shaft connected between said two parallel side wall portions and received in the axially extended cylindrical coupling groove in said winding holder.

2. The EMI preventive AC line filter of claim 1 wherein the peripheral wall of said iron core has a rectangular cross section.

3. The EMI preventive AC line filter of claim 1 wherein said rack comprises a plurality of wire grooves at two opposite lateral side walls thereof for guiding out lead wires from the windings at said winding holder.

4. The EMI preventive AC line filter of claim 3 wherein said rack comprises a plurality of bottom mounting rods raised from a bottom side wall thereof adjacent to said wire grooves for the connection of the lead wires of the windings at said winding holder.

5. The EMI preventive AC line filter of claim 1 wherein said iron core is comprised of two symmetrical halves, the symmetrical halves of said iron core each comprising a semi-circular shaft connected between two parallel side wall portions of a substantially U-shaped peripheral wall thereof.

* * * * *